(12) United States Patent
Hasegawa et al.

(10) Patent No.: US 7,554,776 B2
(45) Date of Patent: Jun. 30, 2009

(54) CCP MAGNETIC DETECTING ELEMENT INCLUDING A SELF-PINNED COFE LAYER

(75) Inventors: Naoya Hasegawa, Niigata-ken (JP); Masamichi Saito, Niigata-ken (JP); Yosuke Ide, Niigata-ken (JP); Masahiko Ishizone, Niigata-ken (JP)

(73) Assignee: TDK Corporation, Tokyo (JP)

( * ) Notice: Subject to any disclaimer, the term of this patent is extended or adjusted under 35 U.S.C. 154(b) by 485 days.

(21) Appl. No.: 11/216,870

(22) Filed: Aug. 29, 2005

(65) Prior Publication Data

US 2006/0044705 A1    Mar. 2, 2006

(30) Foreign Application Priority Data

Sep. 1, 2004    (JP) ............... 2004-253683

(51) Int. Cl.
*G11B 5/39*    (2006.01)
(52) U.S. Cl. ................................. 360/324.11
(58) Field of Classification Search .... 360/324.1–324.2
See application file for complete search history.

(56) References Cited

U.S. PATENT DOCUMENTS 6,905,780 B2 *    6/2005    Yuasa et al. ................. 428/611

| | | |
|---|---|---|
| 2004/0067389 A1 | 4/2004 | Hasegawa et al. |
| 2006/0044703 A1 | 3/2006 | Inomata et al. |

FOREIGN PATENT DOCUMENTS

| | | |
|---|---|---|
| JP | 08-250366 A | 9/1996 |
| JP | 2002-319772 | 10/2002 |
| JP | 2003-8105 | 1/2003 |
| JP | 2003-298148 | 10/2003 |
| JP | 2003-309305 | 10/2003 |
| JP | 2004-014806 | 1/2004 |
| JP | 2004-146480 A | 5/2004 |
| JP | 2004-186659 A | 7/2004 |
| JP | 2004-221526 A | 8/2004 |

OTHER PUBLICATIONS

Office Action issued in corresponding Japanese Patent Application No. 2004-253683; issued Apr. 28, 2009.

* cited by examiner

*Primary Examiner*—A. J. Heinz
(74) *Attorney, Agent, or Firm*—Brinks Hofer Gilson & Lione (57) ABSTRACT

A CPP magnetic sensing element is provided which may exhibit a large value of ΔRA (the product of the resistance variation ΔR and area A of the magnetic sensing element). The magnetic sensing element includes a free magnetic layer and a pinned magnetic layer. At least one of these layers has a $(Co_{0.67}Fe_{0.33})_{100-a}Z_a$ alloy layer, wherein Z may represent at least one element selected from the group consisting of Al, Ga, Si, Ge, Sn, and Sb, and the parameter a may satisfy the relationship $0 < a \leq 30$ in terms of atomic percent.

12 Claims, 6 Drawing Sheets

CCP MAGNETIC DETECTING ELEMENT INCLUDING A SELF-PINNED COFE LAYER

This application claims the benefit of priority to Japanese Patent Application No. 2004-253683, which was filed on Sep. 1, 2004, and which is incorporated herein by reference.

TECHNICAL FIELD

The present application relates to multilayer CPP (current-perpendicular-to-the-plane) magnetic sensing elements in which sense current flows in a direction perpendicular to the layer surfaces, and in particular to a magnetic sensing element having a structure capable of achieving a high product ($\Delta RA$) of resistance variation and area.

BACKGROUND

Figure 9:
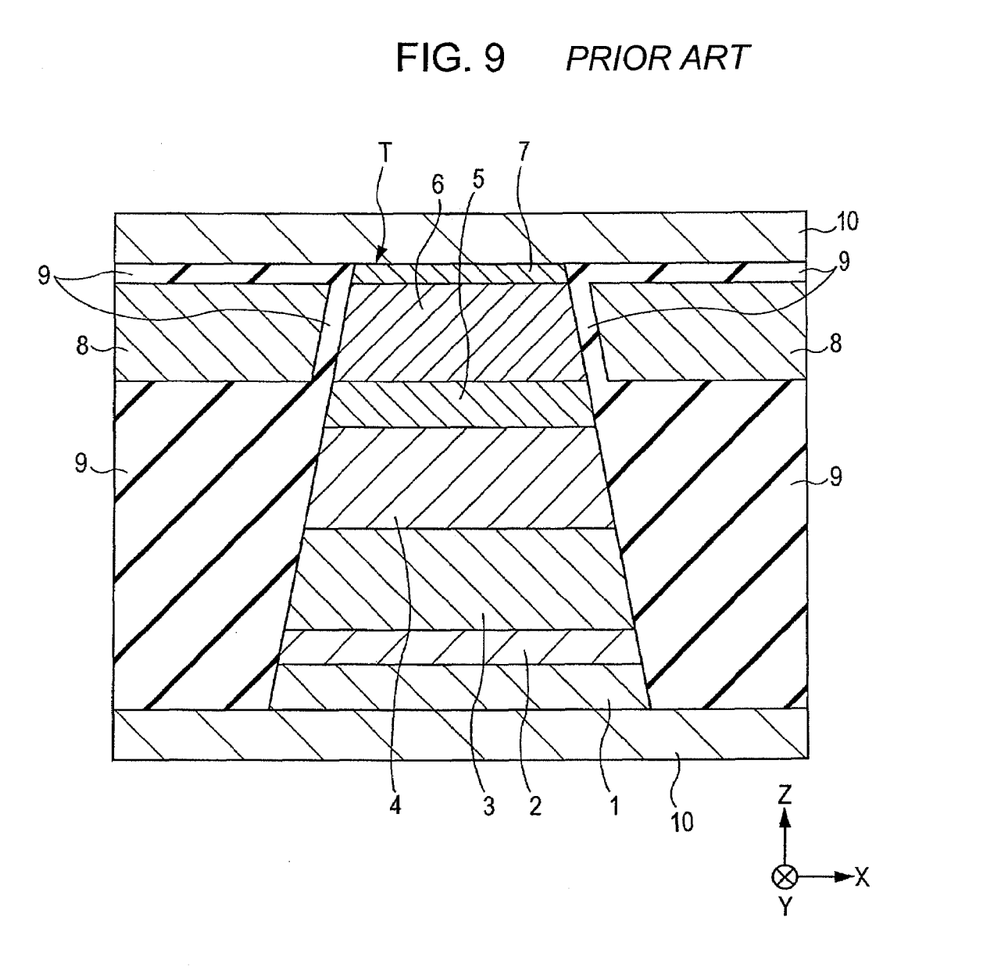
FIG. 9 is a sectional view of a known magnetic sensing element.

FIG. 9 is a cross-sectional view of a known magnetic sensing element (spin-valve thin film element) taken in a direction parallel to a surface opposing a recording medium.

The magnetic sensing element shown in FIG. 9 includes a Ta underlayer 1 and a seed layer 2 made of a metal having a bcc (body-centered cubic) structure, such as Cr, on the underlayer 1.

The seed layer 2 underlies a multilayer composite T1 formed by depositing an antiferromagnetic layer 3, a pinned magnetic layer 4, a nonmagnetic material layer 5, a free magnetic layer 6, and a protective layer 7, in that order.

The protective layer 7 is formed of Ta; the free magnetic layer 6 is formed of NiFe; the nonmagnetic material layer 5 is formed of Cu; the pinned magnetic layer 4 is formed of a Heusler alloy, such as $Co_2MnGe$; and the antiferromagnetic layer 3 is formed of PtMn.

The multilayer composite T1 has electrode layers 10 on its top and bottom which apply a sense current in a direction perpendicular to the layers of the multilayer composite.

The magnetization of the pinned magnetic layer 4 is fixed in the height direction (Y direction) by an exchange coupling magnetic field generated between the antiferromagnetic layer 3 and the pinned magnetic layer 4.

A hard bias layer 8 made of a hard magnetic material, such as CoPt, is disposed on each side of the free magnetic layer 6. The upper and lower surfaces and sides of the hard bias layer 8 are insulated by an insulating layer 9. The magnetization of the free magnetic layer 3 is oriented in the track width direction (X direction) by a longitudinal bias magnetic field from the hard bias layer 8.

When an external magnetic field is applied to the magnetic sensing element shown in FIG. 9, the direction of the magnetization of the free magnetic layer 3 is changed relative to the magnetization direction of the pinned magnetic layer 5, so that the resistance of the multilayer composite is varied. If a constant sense current flows, the external magnetic field can be detected by measuring a change in voltage resulting from the variation in resistance.

Magnetic sensing elements including a pinned magnetic layer made of a Heusler alloy have been disclosed in Japanese Unexamined Patent Application Publication Nos. 2003-309305 and 2002-319722.

Japanese Unexamined Patent Application Publication No. 2003-309305 has disclosed a pinned magnetic layer made of a Heusler alloy, such as a CoMnGe alloy. However, the magnetostriction and coercive force of the CoMn-based alloys are low. A more suitable material with a high uniaxial anisotropy is desirable for the pinned magnetic layer.

Japanese Unexamined Patent Application Publication No. 2002-319722 has disclosed a tunneling magnetic sensing element including a free magnetic layer and a pinned magnetic layer that are made of a Heusler alloy.

This magnetic sensing element is a tunneling magnetoresistive element (TMR), however, in which the free magnetic layer and the pinned magnetic layer are separated by an insulating material layer (hereinafter referred to as a barrier layer) through which electrons are transmitted by tunneling. Thus, this magnetic sensing element is different from spin-valve GMR elements as disclosed in, for example, Japanese Unexamined Patent Application Publication No. 2003-309305.

The electrical resistance of a TMR element depends on the transition probability of the quantum mechanical states of electrons present at both sides of the barrier layer and the probability of the existence of electrons at both sides of the barrier layer. More specifically, when the potential energy of the barrier layer is represented by V and the states of the electrons at both sides of the barrier layer are represented by <k'| and |k> (according to a Dirac bracket notation), <k'|V|k> is proportional to the transition probability.

On the other hand, in spin-valve GMR elements, a free magnetic layer and a pinned magnetic layer are stacked with a nonmagnetic conductive material layer therebetween, and conduction electrons flow in a direction perpendicular to the surfaces of those layers. Therefore, changes in classical mean free path of up-spin conduction electrons and down-spin conduction electrons are important.

TMR elements and spin-valve GMR elements significantly differ from each other in the mechanisms of the magnetoresistive effect.

SUMMARY OF THE INVENTION

A magnetic sensing element including a multilayer composite having a pinned magnetic layer whose magnetization is fixed in one direction, a free magnetic layer, and a nonmagnetic material layer disposed between the pinned magnetic layer and the free magnetic layer is described. At least one of the free magnetic layer and the pinned magnetic layer may include a $(Co_{0.67}Fe_{0.33})_{100-a}Z_a$ alloy layer, wherein Z may represent at least one element selected from the group consisting of Al, Ga, Si, Ge, Sn, and Sb, and the parameter a may satisfy the relationship $0<a\leqq30$ in terms of atomic percent.

A $(Co_{0.67}Fe_{0.33})_{100-a}Z_a$ alloy layer having the above-described composition may increase the $\Delta RA$ value, wherein $\Delta RA$ is the product of the resistance variation $\Delta R$ and the element area A of the magnetic sensing element.

Since the $(Co_{0.67}Fe_{0.33})_{100-a}Z_a$ alloy layer may have a relatively large magnetostriction, it may enhance the uniaxial anisotropy of the pinned magnetic layer, thereby helping to firmly fix the magnetization direction of the pinned magnetic layer.

The present advancement may be advantageously applied to so-called self-pinned magnetic sensing elements including a pinned magnetic layer whose magnetization direction is fixed in one direction by the uniaxial anisotropy of the pinned magnetic layer.

DETAILED DESCRIPTION

Figure 1:
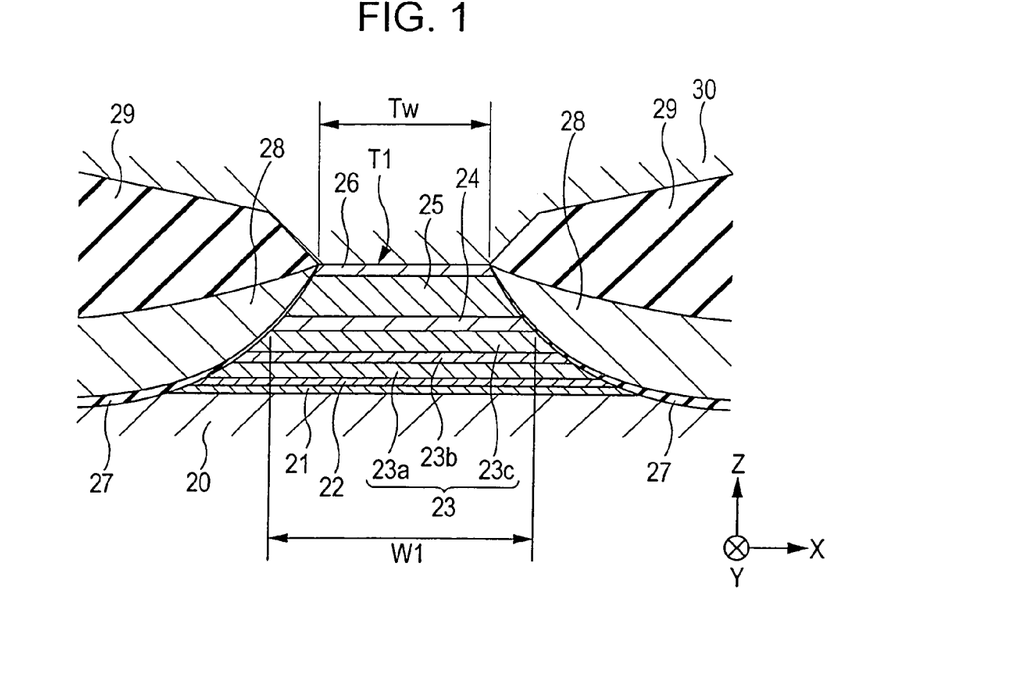
FIG. 1 is a sectional view of a magnetic sensing element according to a first embodiment.

FIG. 1 is a sectional view of a magnetic sensing element according to a first embodiment, viewed from a side surface opposing the recording medium.

The magnetic sensing element shown in FIG. 1 includes a multilayer composite T1 formed by depositing a seed layer 21, a nonmagnetic metal layer 22, a pinned magnetic layer 23, a nonmagnetic material layer 24, a free magnetic layer 25, and a protective layer 26 in that order from below. The pinned magnetic layer 23 has an artificial ferrimagnetic structure constituted of a first magnetic layer 23a and a second magnetic layer 23c with a nonmagnetic interlayer 23b therebetween.

The seed layer 21 may be made of a NiFe alloy, a NiFeCr alloy, Cr, Ta, or the like. For example, the seed layer 21 may be formed of about 60 atomic percent of $(Ni_{0.8}Fe_{0.2})$ and about 40 atomic percent of Cr to a thickness of from about 35 to about 60 Å.

The seed layer 21 may help to improve the orientation of the (111) crystallographic planes of the nonmagnetic metal layer 22.

The nonmagnetic metal layer 22 may be made of an X—Mn alloy (X represents at least one element selected from the group consisting of Pt, Pd, Ir, Rh, Ru, Os, Ni, and Fe), or at least one element selected from the group consisting of Ru, Re, Os, Ti, Rh, Ir, Pd, Pt, and Al.

The nonmagnetic metal layer 22 may have a thickness in the range of from about 5 to about 50 Å.

A thickness in this range of the X—Mn nonmagnetic metal layer 22 may allow the nonmagnetic metal layer 22 to maintain its original face-centered cubic (fcc) crystal structure. A thickness larger than 50 Å of the nonmagnetic metal layer 22 may not be suitable, because if the nonmagnetic metal layer 22 is heated to 250° C. or more, its crystal structure may be transformed into an ordered CuAuI-type face-centered tetragonal (fct) structure. However, even a nonmagnetic metal layer 22 with a thickness of more than 50 Å may maintain its original face-centered cubic (fcc) structure if it is not heated to 250° C. or more.

The transformation into an ordered CuAuI-type phase is generally unfavorable from the viewpoint of enhancing the magnetostriction because atoms in the nonmagnetic metal layer 22 may be rearranged in the course of the phase change so that the alignment at the interface with the first magnetic layer 23a is distorted. It is, however, permitted that the nonmagnetic metal layer partially transforms into an ordered phase. If only a part of the crystal structure is transformed into an ordered phase, the magnetostriction may not be significantly reduced and, further, the coercive force of the first magnetic layer 23a may be enhanced by antiferromagnetism.

If the X—Mn nonmagnetic metal layer 22 has a face-centered cubic (fcc) structure, an exchange coupling magnetic field may not be generated at the interface between the nonmagnetic metal layer 22 and the first magnetic layer 23a, or it may be extremely small. Consequently, the magnetization direction of the first magnetic layer 23a may not be fixed by the exchange coupling magnetic field.

Substantially the entire nonmagnetic metal layer 22 may have a blocking temperature $T_B$ that is lower than room temperature and is accordingly nonmagnetic. However, a portion of the nonmagnetic metal layer 22 may have an antiferromagnetic phase with a blocking temperature that is higher than room temperature.

The pinned magnetic layer 23 may have an artificial ferrimagnetic structure constituted of a first magnetic layer 23a and a second magnetic layer 23c with a nonmagnetic interlayer 23b therebetween, as described above. The magnetization of the pinned magnetic layer 23 may be fixed in the direction parallel to the height direction (Y direction) by its uniaxial anisotropy.

The materials of the first magnetic layer 23a and the second magnetic layer 23c will be described later.

The nonmagnetic material layer 24 may prevent magnetic coupling between the pinned magnetic layer 23 and the free magnetic layer 25, and may be made of an electrically conductive nonmagnetic material, such as Cu, Cr, Au, and Ag. Cu may be particularly preferred. The nonmagnetic material layer may have a thickness of from about 17 to about 50 Å.

The material of the free magnetic layer 25 will also be described later.

The protective layer 26, which may be made of Ta or the like, may prevent the multilayer composite T1 from oxidizing. The thickness of the protective layer 26 may be in the range of from about 10 to about 50 Å.

The magnetic sensing element shown in FIG. 1 also includes an insulating layer 27, a hard bias layer 28, and another insulating layer 29 at both sides of multilayer composite T1 from the seed layer 21 to the protective layer 26.

The hard bias layer 28 may be made of, for example, a Co—Pt (cobalt—platinum) alloy or a Co—Cr—Pt (cobalt—chromium—platinum) alloy, and the insulating layers 27 and 29 may be made of alumina, silicon oxide, or the like. The hard bias layer 28 may have a thickness of from about 100 to about 400 Å.

A lower electrode layer 20 and an upper electrode layer 30 are respectively disposed under and over the multilayer composite T1. The electrode layers 20 and 30 may be formed of Cr, Ta, Rh, Au, W, or the like to a thickness of from about 400 to about 1,500 Å.

The magnetization of the free magnetic layer 25 may be oriented in the track width direction (X direction) by a longitudinal bias magnetic field from the hard bias layer 28, and may be sensitively changed according to a signal magnetic field (external magnetic field) of the recording medium. On the other hand, the magnetization of the pinned magnetic layer 23 may be fixed in a direction parallel to the height direction (Y direction).

The electrical resistance depends on the relationship in magnetization direction between the free magnetic layer 25 and the pinned magnetic layer 23 (particularly the second magnetic layer 23c). The leakage magnetic field from the recording medium may be detected by changes in voltage or current resulting from the changes in electrical resistance.

The magnetic sensing element according to the first embodiment features the following:

The pinned magnetic layer 23 has an artificial ferrimagnetic structure constituted of the first magnetic layer 23a and the second magnetic layer 23c with the nonmagnetic interlayer 23b therebetween. The magnetizations of the first magnetic layer 23a and the second magnetic layer 23c are oriented in directions antiparallel to each other by their Ruderman-Kittel-Kasuya-Yosida (RKKY) interaction through the nonmagnetic interlayer 23b.

At least one of the free magnetic layer 25 and the second magnetic layer 23c of the pinned magnetic layer 23 may be formed of a $(Co_{0.67}Fe_{0.33})_{100-a}Z_a$ alloy, wherein Z represents at least one element selected from the group consisting of Al, Ga, Si, Ge, Sn, and Sb, and the composition parameter a satisfies $0<a\leq 30$ in terms of atomic percent.

The $(Co_{0.67}Fe_{0.33})_{100-a}Z_a$ alloy layer may be made of half metal. This may allow the direct current resistance of the magnetic sensing element to vary significantly depending on whether the magnetization directions of the free magnetic layer 25 and the second magnetic layer 23c are parallel or antiparallel. "Half metal" refers to a magnetic material that acts in a metallic manner for one type of spin conduction electrons and in an insulating manner for the other type.

The above composition of the $(Co_{0.67}Fe_{0.33})_{100-a}Z_a$ alloy layer may increase the $\Delta RA$ value (product of the resistance variation $\Delta R$ and the element area A) of the magnetic sensing element.

It may be preferable that the composition parameter a of the $(Co_{0.67}Fe_{0.33})_{100-a}Z_a$ alloy layer satisfies the relationship $7\leq a\leq 30$ in terms of atomic percent. It may be even more preferable that the composition parameter a satisfies the relationship $22\leq a\leq 28$.

Element Z of the $(Co_{0.67}Fe_{0.33})_{100-a}Z_a$ alloy layer may represent, for example, Al and/or Ga.

The $(Co_{0.67}Fe_{0.33})_{100-a}Z_a$ alloy layer may have a relatively large magnetostriction, and it may be preferable that only the pinned magnetic layer 23 of the free magnetic layer 25 and pinned magnetic layer 23 has the $(Co_{0.67}Fe_{0.33})_{100-a}Z_a$ alloy layer.

Accordingly, the free magnetic layer 25 may be made of a magnetic material such as a NiFe alloy or a CoFe alloy. In particular, if the free magnetic layer 25 is made of a NiFe alloy, a diffusion-preventing layer (not shown) made of Co, CoFe, or the like may be provided between the free magnetic layer 25 and the nonmagnetic material layer 24. The free magnetic layer 25 may have a thickness of from about 20 to about 60 Å. The free magnetic layer 25 may have an artificial ferrimagnetic structure constituted of a plurality of magnetic layers separated by nonmagnetic interlayers.

Since the $(Co_{0.67}Fe_{0.33})_{100-a}Z_a$ alloy may have a relatively large magnetostriction, the $(Co_{0.67}Fe_{0.33})_{100-a}Z_a$ alloy layer may be particularly advantageous in self-pinned magnetic sensing elements, including a pinned magnetic layer whose magnetization direction is fixed in one direction by its uniaxial anisotropy as in the present embodiment.

The $(Co_{0.67}Fe_{0.33})_{100-a}Z_a$ alloy layer may overlie a CoFe alloy layer having a body-centered cubic (bcc) structure. The CoFe alloy may have a composition expressed by $Co_{1-x}Fe_x$, wherein x satisfies the relationship $25\leq x\leq 95$ in terms of atomic percent.

The second magnetic layer 23c may have a thickness of from about 30 to about 80 Å.

The magnetization of the first magnetic layer 23a of the pinned magnetic layer 23 may be fixed in a uniaxial direction mainly by magnetoelasticity.

Magnetoelasticity is controlled by magnetoelastic energy. The magnetoelastic energy may be defined by the stress $\sigma$ placed on the pinned magnetic layer 23 and the magnetostriction coefficient $\lambda S$ of the pinned magnetic layer 23.

Figure 2:
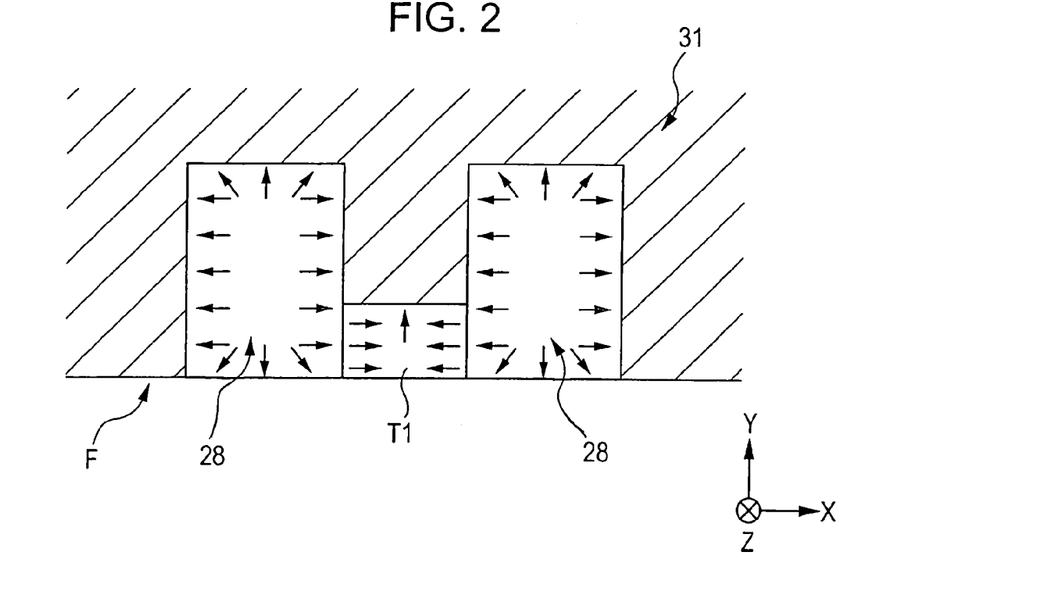
FIG. 2 is a plan view of the magnetic sensing element shown in FIG. 1.

FIG. 2 is a plan view of the magnetic sensing element shown in FIG. 1, viewed in a direction opposite to the Z direction. The multilayer composite T1 of the magnetic sensing element is disposed between a pair of hard bias layers 28. The external region of the multilayer composite T1 and hard bias layers 28 are filled with an insulating material layer 31 indicated by oblique lines.

The side surface F opposing the recording medium, defined by ends of the multilayer composite T1, may be exposed or covered with a thin protective layer made of, for example, diamond-like carbon (DLC) with a thickness of from about 20 to about 50 Å, and may be open.

Consequently, a tensile stress may be placed on the multilayer composite T1 in the height direction (Y direction). If the hard bias layer 28 has an internal compressive stress, a compressive stress may be placed on the multilayer composite T1 in the directions parallel and antiparallel to the track width direction (X direction).

More specifically, a tensile stress in the height direction and a compressive stress in the track width direction may be applied to the pinned magnetic layer 23 having the open end surface F opposing the recording medium. The easy magnetization axis of the first magnetic layer 23a, which is made of a magnetic material having a positive magnetostriction coefficient, may be pointed to the back of the magnetic sensing element (in the height direction or Y direction) by the magnetoelasticity. Consequently, the magnetization of the first magnetic layer 23a may be fixed in the direction parallel or antiparallel to the height direction. The magnetization of the second magnetic layer 23c may be fixed in the direction antiparallel to that of the first magnetic layer 23a by the RKKY interaction through the nonmagnetic interlayer 23b between the first magnetic layer 23a and the second magnetic layer 23c.

The atoms constituting the first magnetic layer 23a and nonmagnetic metal layer 22 may be easily aligned, and a portion of the crystals in the nonmagnetic metal layer 22 and pinned magnetic layer 23 may be in an epitaxial state or a heteroepitaxial state.

In order to distort the crystal structure to increase the magnetostriction of the first magnetic layer 23a, with the atoms constituting the nonmagnetic metal layer 22 and first magnetic layer 23a in alignment, it is preferable that the content of element X (at least one element selected from the group consisting of Pt, Pd, Ir, Rh, Ru, Os, Ni, and Fe) in the X—Mn nonmagnetic metal layer 22 be appropriately controlled.

For example, an element X content of about 51 atomic percent or more in the X—Mn alloy may increase the magnetostriction of the first magnetic layer 23a overlying the X—Mn nonmagnetic metal layer 22. An element X content in the range of from about 45 to about 99 atomic percent in the X—Mn alloy may lead to a high magnetostriction of the first magnetic layer 23a. An element X content in the range of from about 55 to about 99 atomic percent in the X—Mn alloy may stabilize the magnetostriction of the first magnetic layer 23a to a high value.

It may be preferred that the element X content in the X—Mn alloy is in the range of from about 17 to about 99 atomic percent.

It may be even more preferred that the element X is Ir and the Ir content in the Ir—Mn alloy is in the range of from about 20 to about 99 atomic percent.

This composition may increase the magnetostriction of the first magnetic layer 23a appropriately.

The first magnetic layer 23a may be formed of a magnetic material containing mainly Co and Fe, and further a rare earth element or a noble metal.

In the present invention, the rare earth element may be selected from the group consisting of Tb, Sm, Pr, Y, Ce, Nd, Gd, Dy, Ho, Er, and Yb. In this instance, the magnetic material of the first magnetic layer 23a may have a composition expressed by $(Co_xFe_{1-x})_{100-y}M_y$. The element M may be selected from the group consisting of Tb, Sm, Pr, Y, Ce, Nd, Gd, Dy, Ho, Er, and Yb, and composition parameter y may be in the range of from about 0.3 to about 5 atomic percent.

By setting the composition parameter y or element M content in the range of from about 0.3 to about 5 atomic percent, the magnetostriction of the first magnetic layer 23a may be appropriately increased. If the element M content is about 4 atomic percent or less, the magnetostriction coefficient of such a magnetic material may be higher than that of a magnetic material not containing element M.

Alternatively, a noble metal may be used in the magnetic material. Preferred noble metals include Pt, Rh, Ir, and Re. In this instance, the magnetic material of the first magnetic layer 23a may have a composition expressed by $(Co_xFe_{1-x})_{100-z}N_z$. Preferably, element N may be selected from the group consisting of Pt, Rh, Ir, and Re, and composition parameter Z may be in the range of from about 5 to about 20 atomic percent. Preferably, the composition parameter x may be 1 or in the range of from about 0.4 to about 0.6. The first magnetic layer 23a having such a composition may have a high coercive force Hc.

The first magnetic layer 23a may have a face-centered cubic (fcc) structure or a body-centered cubic (bcc) structure in its entirety or in the vicinity of the interface with the nonmagnetic metal layer 22, and the equivalent crystal planes represented by {111} or {110} in the first magnetic layer 23a may be preferentially oriented in a direction parallel to the interface.

Preferably, the first magnetic layer 23a may have a thickness of from about 12 to about 40 Å. An excessively large thickness may make the distortion of the first magnetic layer 23a small, consequently reducing the magnetostriction coefficient λS and the uniaxial anisotropy.

Figure 3:
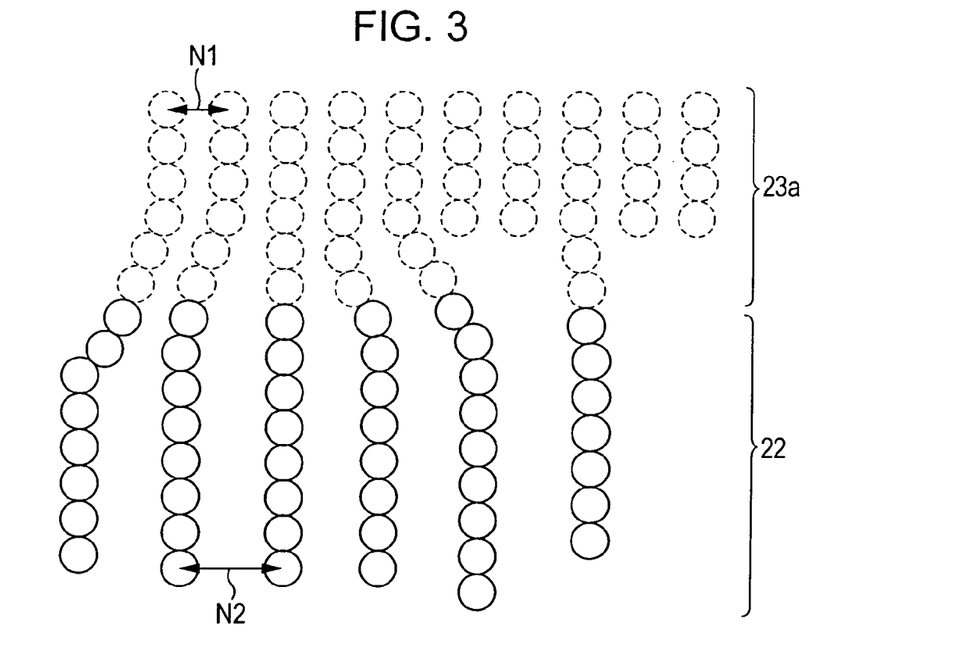
FIG. 3 is a schematic diagram of a state where distortion occurs in a nonmagnetic metal layer and a pinned magnetic layer.

In the magnetic sensing element according to the present embodiment, the atoms constituting the nonmagnetic metal layer 22 and first magnetic layer 23a may be aligned, as schematically shown in FIG. 3, while the crystal structure in the vicinity of the interface between these layers may be distorted. Thus, the magnetostriction coefficient λS of the first magnetic layer 23a may be increased.

Furthermore, the second magnetic layer 23c of the pinned magnetic layer 23 may be formed of the above-described $(Co_{0.67}Fe_{0.33})_{100-a}Z_a$ alloy to increase the magnetostriction coefficient, thus enhancing the magnetoelastic energy. Accordingly, the uniaxial anisotropy of the pinned magnetic layer 23 may become high. In the present invention, the high uniaxial anisotropy of the second magnetic layer 23c may allow the magnetization of the pinned magnetic layer 23 to be fixed even if the thickness of the second magnetic layer 23c is large. A large thickness of the second magnetic layer 23c may lead to a high ΔRA value of the magnetic sensing element.

A larger uniaxial anisotropy of the pinned magnetic layer 23 may more firmly fix the magnetization of the pinned magnetic layer 23 in a specific direction. Thus, the power of the magnetic sensing element may be increased with enhanced power stability and symmetry. The resulting magnetic sensing element may not allow the magnetization to reverse even if a transient current resulting from electrostatic discharge (ESD) flows.

Figure 4:
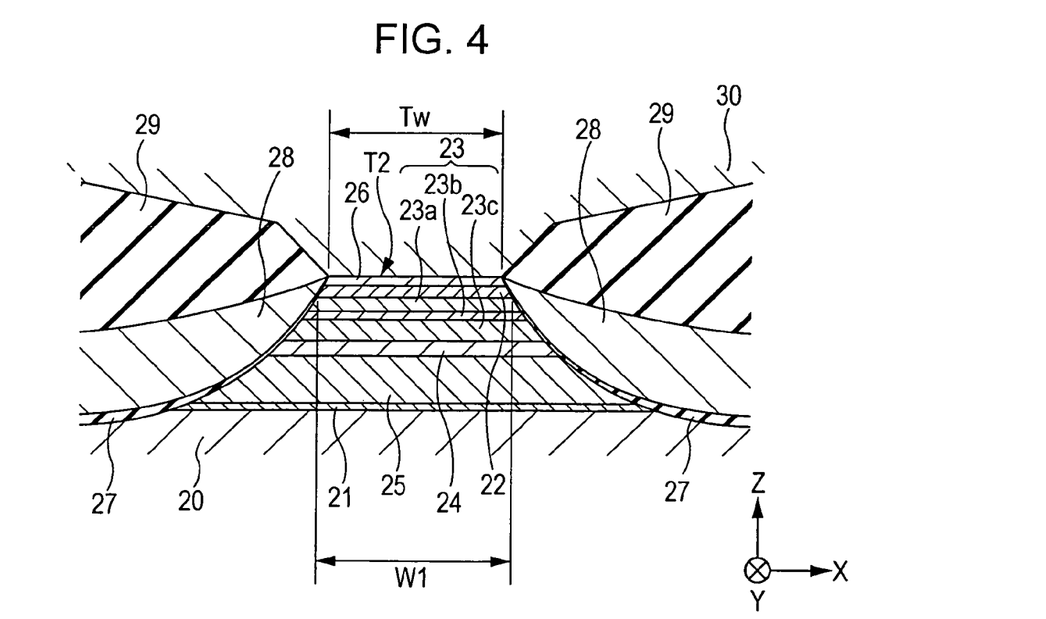
FIG. 4 is a sectional view of a magnetic sensing element according to a second embodiment.

FIG. 4 is a sectional view of a magnetic sensing element according to a second embodiment, viewed from the side surface opposing the recording medium.

The magnetic sensing element shown in FIG. 4 is similar to the magnetic sensing element shown in FIG. 1, except that the multilayer composite T1 is replaced with another structure. The multilayer composite T2 of the second embodiment is formed by depositing a seed layer 21, a free magnetic layer 25, a nonmagnetic material layer 24, a pinned magnetic layer 23, a nonmagnetic metal layer 22, and a protective layer 26 in that order from below. The pinned magnetic layer 23 includes a second magnetic layer 23c, a nonmagnetic interlayer 23b, and a first magnetic layer 23a. The layers constituting the multilayer composite T2 are deposited in inverse order to the layers of the multilayer composite T1.

In the magnetic sensing element of the present embodiment as well, at least one of the free magnetic layer 25 and the second magnetic layer 23c of the pinned magnetic layer 23 may be formed of a $(Co_{0.67}Fe_{0.33})_{100-a}Z_a$ alloy, wherein Z may represent at least one element selected from the group consisting of Al, Ga, Si, Ge, Sn, and Sb, and the composition parameter a may satisfy 0<a≦30 in terms of atomic percent.

The $(Co_{0.67}Fe_{0.33})_{100-a}Z_a$ alloy layer may be made of half metal. This may allow the direct current resistance of the magnetic sensing element to vary significantly depending on whether the magnetization directions of the free magnetic layer 25 and the second magnetic layer 23c of the pinned magnetic layer 23 are parallel or antiparallel.

The above composition of the $(Co_{0.67}Fe_{0.33})_{100-a}Z_a$ alloy layer may increase the ΔRA value (product of the resistance variation ΔR and the element area A) of the magnetic sensing element.

Preferably, the parameter a of the $(Co_{0.67}Fe_{0.33})_{100-a}Z_a$ alloy layer may satisfy the relationship 7≦a≦30 in terms of atomic percent. More preferably, the parameter a may satisfy the relationship 22≦a≦28.

Element Z of the $(Co_{0.67}Fe_{0.33})_{100-a}Z_a$ alloy layer may represent, for example, Al and/or Ga.

The $(Co_{0.67}Fe_{0.33})_{100-a}Z_a$ alloy layer may have a relatively large magnetostriction, and it is preferable that only the pinned magnetic layer 23 of the free magnetic layer 25 and pinned magnetic layer 23 may have the $(Co_{0.67}Fe_{0.33})_{100-a}Z_a$ alloy layer.

Since the $(Co_{0.67}Fe_{0.33})_{100-a}Z_a$ alloy may have a relatively large magnetostriction, the $(Co_{0.67}Fe_{0.33})_{100-a}Z_a$ alloy layer may be particularly advantageous in self-pinned magnetic sensing elements, including a pinned magnetic layer whose magnetization direction is fixed in one direction by its uniaxial anisotropy as in the present embodiment.

The $(Co_{0.67}Fe_{0.33})_{100-a}Z_a$ alloy layer may overlie a CoFe layer having a body-centered cubic (bcc) structure. The CoFe alloy may have a composition expressed by $Co_{1-x}Fe_x$, wherein x satisfies the relationship 25≦x≦95 in terms of atomic percent.

The second magnetic layer 23c may have a thickness of from about 30 to about 80 Å.

Figure 5:
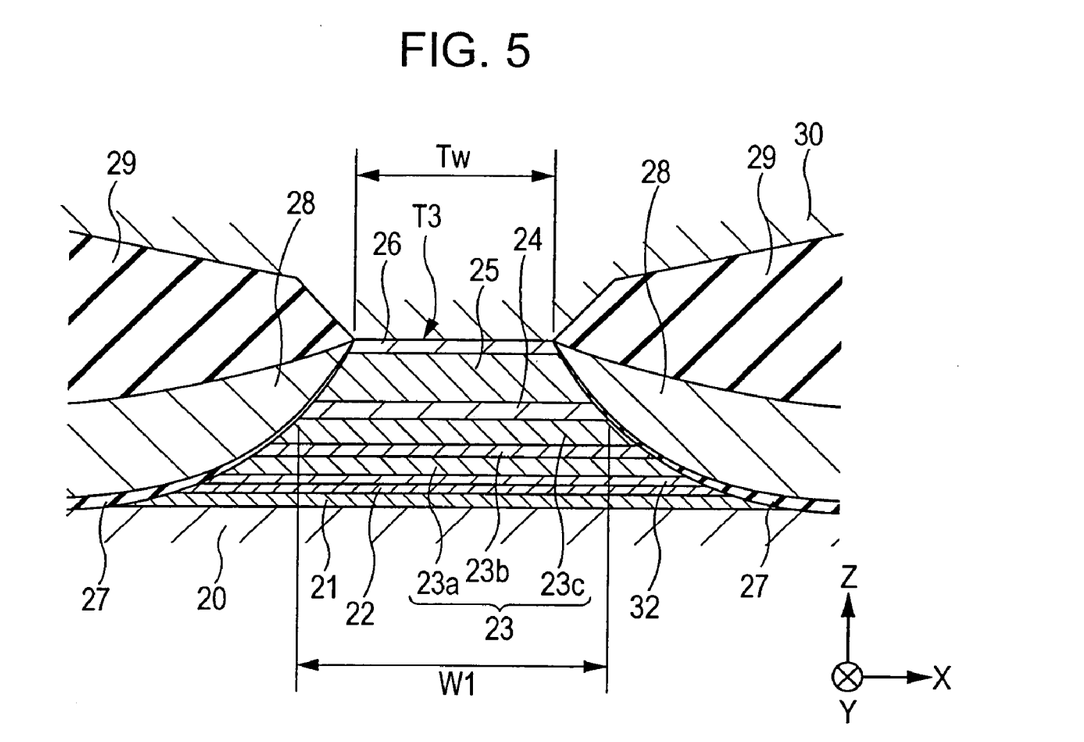
FIG. 5 is a sectional view of a magnetic sensing element according to a third embodiment.

FIG. 5 is a sectional view of a magnetic sensing element according to a third embodiment, viewed from the side surface opposing the recording medium.

The magnetic sensing element shown in FIG. 5 has a multilayer composite T3 similar to the multilayer composite T1 shown in FIG. 1, except that a nonmagnetic layer 32 is disposed between the pinned magnetic layer 23 and the nonmagnetic metal layer 22. Preferably, the nonmagnetic layer 32 is in contact with the pinned magnetic layer 23. The nonmagnetic layer 32 is intended to increase the coercive force Hc of the pinned magnetic layer 23. By bringing the nonmagnetic layer 32 into contact with the pinned magnetic layer 23, the coercive force Hc of the pinned magnetic layer 23 may be increased more effectively.

The nonmagnetic layer 32 may be formed of Cu or a $(Ni_u Fe_{1-u})_{100-v} Cr_v$ alloy, wherein the composition parameter u has a value in the range of from about 0 to about 1 atomic percent and the composition parameter v has a value in the range of from about 18 to about 50 atomic percent or about 90 to about 100 atomic percent. The values of the composition parameters u and v may be set in such ranges that the $(Ni_u Fe_{1-u})_{100-v} Cr_v$ alloy has nonmagnetic characteristics.

The composition parameter u may have a value in the range of from about 0.7 to about 1 atomic percent, and the composition parameter v may have a value in the range of from about 22 to about 45 atomic percent. By setting the values of u and v in these ranges, the coercive force Hc of the pinned magnetic layer 23 may be increased more effectively.

The nonmagnetic layer 32 may have a thickness in the range of from about 3 Å to about 10 Å.

The embodiment shown in FIG. 5 features the structure of nonmagnetic metal layer 22/nonmagnetic layer 32/pinned magnetic layer 23, deposited in that order. This structure may increase the magnetostriction coefficient and coercive force Hc of the pinned magnetic layer 23.

In the present embodiment, the uniaxial anisotropy, which results from the relationship between the compressive stress from both sides of the pinned magnetic layer 23 and the magnetostriction, fixes the magnetization direction of the pinned magnetic layer 23. The compressive stress placed on the pinned magnetic layer 23 may be strong at both ends in the optical track width direction, and weak in the middle. Hence, if the length in the optical track width direction of the pinned magnetic layer 23 is large, the force for fixing the magnetization direction of the pinned magnetic layer 23 may be reduced. It is therefore preferable that the optical track width W1 of the pinned magnetic layer 23 be about 0.15 µm or less.

Preferably, the magnetostriction of the free magnetic layer 25 may be negative. Since any of the multilayer composites T1, T2, and T3 of the foregoing magnetic sensing elements may be subjected to a compressive stress, as described above, the direction parallel or antiparallel to the track width direction (X direction) of the free magnetic layer 25 having a negative magnetostriction may act as an easy magnetization axis due to the magnetoelasticity.

Preferably, the λS of the free magnetic layer 25 may be in the range of about $-8 \times 10^{-6} \leq \lambda \leq -0.5 \times 10^{-6}$. Preferably, the hard bias layer 28 may have a thickness t in the range of about $100 \leq t \leq 200$ Å. An excessively low magnetostriction coefficient λS of the free magnetic layer 25 or an excessively large thickness t of the hard bias layer 28 may degrade the reproduction sensitivity of the magnetic sensing element. In contrast, an excessively high magnetostriction coefficient λS of the free magnetic layer 25 or an excessively small thickness t of the hard bias layer 28 may disturb the reproduction waveform of the magnetic sensing element.

Figure 6:
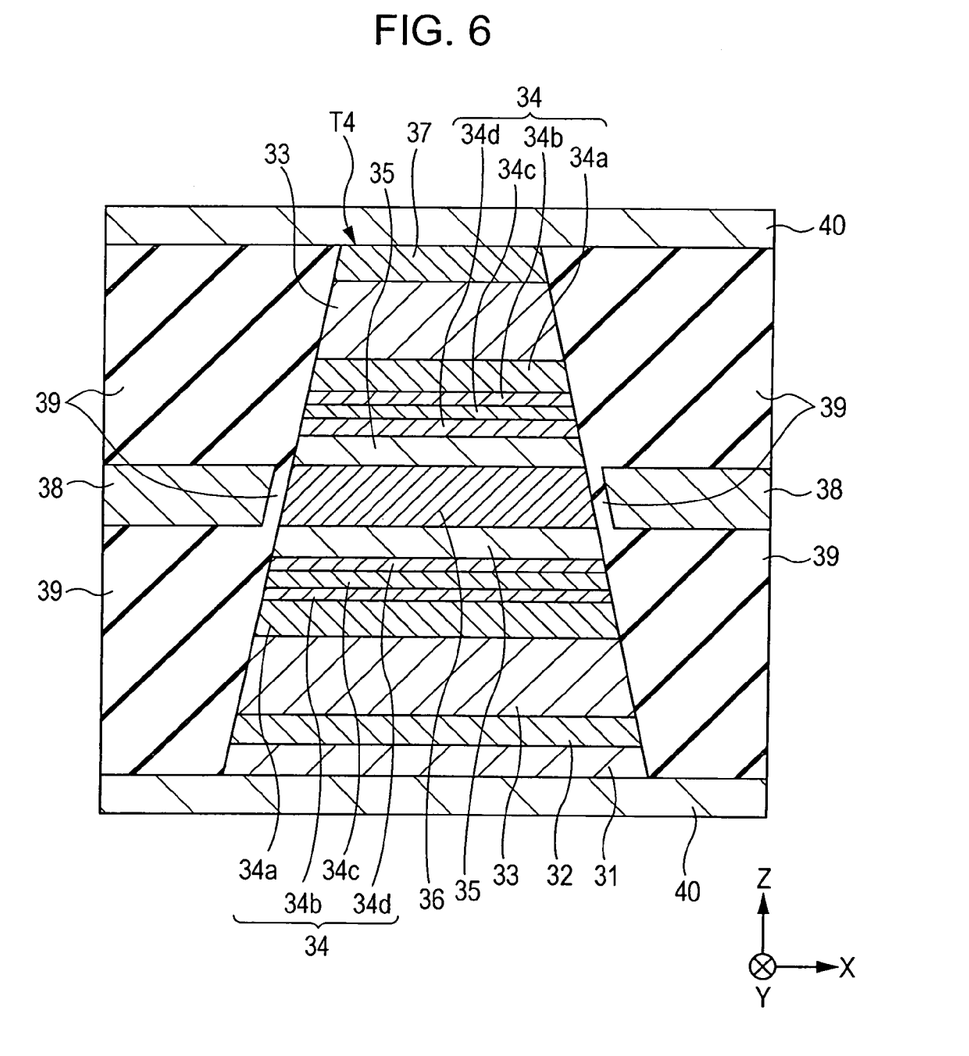
FIG. 6 is a sectional view of a magnetic sensing element according to a fourth embodiment.

FIG. 6 is a sectional view of a magnetic sensing element according to a fourth embodiment, viewed from the side surface opposing the recording medium. The magnetic sensing element shown in FIG. 6 is a so-called dual spin-valve structure.

As shown in FIG. 6, an underlayer 31, a seed layer 32, an antiferromagnetic layer 33, a pinned magnetic layer 34, a nonmagnetic material layer 35, and a free magnetic layer 36 are consecutively deposited from below. Then, a nonmagnetic material layer 35, a pinned magnetic layer 34, an antiferromagnetic layer 33, and a protective layer 37 are consecutively deposited on the free magnetic layer 36. A multilayer composite T4 is thus formed.

The seed layer 32 may be formed of NiFeCr or Cr. The NiFeCr seed layer 32 may have a face-centered cubic (fcc) structure, and its equivalent crystal planes represented by {111} may be preferentially oriented in a direction parallel to the surface of the layer. Alternatively, the seed layer 32 may be formed of Cr. The Cr seed layer 32 may have a body-centered cubic (bcc) structure, and its equivalent crystal planes represented by {110} may be preferentially oriented in a direction parallel to the surface of the layer.

The underlayer 31 may be made of Ta or the like and may have an amorphous-like structure. However, the underlayer 31 may not be required.

The antiferromagnetic layer 33 overlying the seed layer 32 may be formed of an antiferromagnetic material containing elements X and Mn, wherein X is at least one element selected from the group consisting of Pt, Pd, Ir, Rh, Ru, and Os.

The resulting antiferromagnetic layer 33 may have a face-centered cubic (fcc) structure or a face-centered tetragonal (fct) structure.

For example, a binary compound, such as a PtMn alloy or an IrMn alloy, may be used for the antiferromagnetic layer 33.

Alternatively, the antiferromagnetic layer 33 may be formed of an antiferromagnetic material containing elements X, X', and Mn, wherein X' represents at least one element selected from the group consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb, and rare earth elements.

The atoms of element X' may enter the interstices of the space lattice. constituted of X atoms and Mn atoms and/or may be substituted for some of the atoms at the lattice points.

The element X' content preferably may be in the range of from about 0.2 to about 10 atomic percent, and more preferably in the range of from about 0.5 to about 5 atomic percent. In the present invention, the element X may be Pt, and hence, a Pt—Mn—X' alloy may be used.

It may be preferred that the total content of elements X and X' of the antiferromagnetic layer 33 is in the range of from about 45 to about 60 atomic percent, and more preferably in the range of from about 49 to about 56.5 atomic percent. Thus, there may be some distortion at the interface between the antiferromagnetic layer 33 and the pinned magnetic layer 34. The antiferromagnetic layer 33 may undergo a transformation to an ordered state by an appropriate heat treatment.

The nonmagnetic material layer 35 may be formed of the same material as the nonmagnetic material layer 24 of the magnetic sensing element shown in FIG. 1.

The hard bias layer 38 is deposited at both sides of the free magnetic layer 36. The hard bias layer 38 may be insulated by an insulating layer 39 made of alumina or the like. The hard bias layer 38 of the present embodiment may be made of the same material as the hard bias layers 28 of the first embodiment shown in FIG. 1.

Electrode layers 40 are disposed under and over the multilayer composite T4 to form a CPP (current-perpendicular-to-the-plane) GMR magnetic sensing element in which sense current flows perpendicular to the surfaces of the layers constituting the multilayer composite T4.

In the magnetic sensing element shown in FIG. 6, the pinned magnetic layer 34 has a four-layer structure composed of a first magnetic layer 34a, a nonmagnetic interlayer 34b, and a third magnetic layer 34c, and a second magnetic layer 34d. The first magnetic layer 34a may be formed of the same material as the first magnetic layer 23a shown in FIG. 1. The third magnetic layer 34c may be formed of a ferromagnetic material, such as a CoFe alloy.

The magnetization direction of the first magnetic layer 34a may be antiparallel to the third and second magnetic layers 34c and 34d due to an exchange coupling magnetic field at the interface with the antiferromagnetic layer 33 and antiferromagnetic exchange coupling (RKKY interaction) through the nonmagnetic interlayer 34b.

In the present embodiment, at least one of the free magnetic layer 36 and the second magnetic layer 34d of the pinned magnetic layer 34 may be formed of a $(Co_{0.67}Fe_{0.33})_{100-a}Z_a$ alloy, wherein Z represents at least one element selected from the group consisting of Al, Ga, Si, Ge, Sn, and Sb and the composition parameter a satisfies the relationship $0<a\leq30$ in terms of atomic percent. The second magnetic layer 23c may have a thickness of from about 30 to about 80 Å.

The $(Co_{0.67}Fe_{0.33})_{100-a}Z_a$ alloy may be made of half metal. This may allow the direct current resistance of the magnetic sensing element to vary significantly depending on whether the magnetization directions of the free magnetic layer 36 and the second magnetic layer 34d of the pinned magnetic layer 34 are parallel or antiparallel.

The above composition of the $(Co_{0.67}Fe_{0.33})_{100-a}Z_a$ alloy layer may increase the ΔRA value (product of the resistance variation ΔR and the element area A) of the magnetic sensing element.

It may be preferable that the parameter a of the $(Co_{0.67}Fe_{0.33})_{100-a}Z_a$ alloy layer satisfies the relationship $7\leq a\leq 30$ in terms of atomic percent. It may be more preferable that the parameter a satisfies the relationship $22\leq a\leq 28$.

Element Z of the $(Co_{0.67}Fe_{0.33})_{100-a}Z_a$ alloy layer may represent, for example, Al and/or Ga.

The $(Co_{0.67}Fe_{0.33})_{100-a}Z_a$ alloy layer may have a relatively large magnetostriction, and it may be preferable that only the pinned magnetic layer 34 of the free magnetic layer 36 and pinned magnetic layer 34 has the $(Co_{0.67}Fe_{0.33})_{100-a}Z_a$ alloy layer.

If the third magnetic layer 34c underlying the $(Co_{0.67}Fe_{0.33})_{100-a}Z_a$ alloy layer or second magnetic layer 34d has a body-centered cubic (bcc) structure and is made of a CoFe alloy expressed by $Co_{1-x}Fe_x$ ($25\leq x\leq 95$ in terms of atomic percent), the ΔRA value of the magnetic sensing element may be increased; hence the magnetic sensitivity of the magnetic sensing element may be enhanced. The crystallinity or periodicity of the second magnetic layer 34d made of a $(Co_{0.67}Fe_{0.33})_{100-a}Z_a$ alloy also may be enhanced.

The magnetic sensing element of any one of the embodiments shown in FIGS. 1, 4, 5, and 6 may be formed by thin film deposition, such as sputtering or vapor deposition, and patterning using resist photolithography. Sputtering and resist photolithography are processes commonly used for manufacturing magnetic sensing elements.

Any of the multilayer composites T1, T2, T3, and T4 according to the foregoing embodiments may be provided with a hard bias layer at both sides. The hard bias layer may apply a compressive stress to the multilayer composite T1, T2, T3, or T4. However, the hard bias layer may not be required. For example, a composite of a soft magnetic material layer and an antiferromagnetic layer, or an insulating layer may be provided at both sides of the multilayer composite T1, T2, T3, or T4.

While the present invention has been described using preferred embodiments, it will be readily appreciated by those skilled in the art that various modifications in form and detail may be made without departing from the scope and spirit of the invention.

The disclosed embodiments are for illustrative purposes, and the invention is not limited to those embodiments.

EXAMPLE 1

Figure 7:
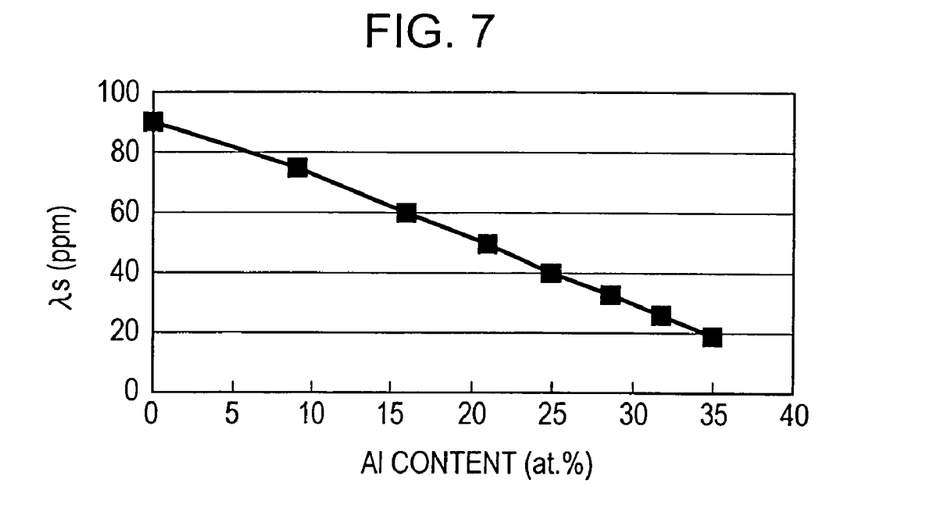
FIG. 7 is a plot of the relationship between the Al content (atomic percent) in and the magnetostriction coefficient λS of $(Co_{0.67}Fe_{0.33})_{100-a}Al_a$ alloy layers having different Al contents.

Multilayer composites each including a $(Co_{0.67}Fe_{0.33})_{100-a}Al_a$ alloy layer having a different Al content were prepared, and the relationship between the Al content and the magnetostriction coefficient λS of the $(Co_{0.67}Fe_{0.33})_{100-a}Al_a$ alloy layer was examined. The results are shown in FIG. 7.

The multilayer composites used for the experiment had the following structure:

substrate/Ta underlayer (30 Å)/NiFeCr seed layer (50 Å)/ $(Co_{0.67}Fe_{0.33})_{100-a}Al_a$ alloy layer (100 Å)/Ta protective layer (30 Å).

The $Co_{67}Fe_{33}$ alloy, or Al-free $(Co_{0.67}Fe_{0.33})_{100-a}Al_a$ alloy, has a magnetostriction coefficient λS of 90 ppm, and as the Al content (atomic percent) is increased, the magnetostriction coefficient λS increases.

The $(Co_{0.67}Fe_{0.33})_{100-a}Al_a$ alloy layer having an Al content of 25 atomic percent had a magnetostriction coefficient λS of 40 ppm, which is higher than the magnetostriction coefficients λS of a CoMnGe or CoMnSi alloy (30 ppm) or a $Co_{90}Fe_{10}$ alloy (20 ppm).

This shows that a pinned magnetic layer made of the $(Co_{0.67}Fe_{0.33})_{100-a}Z_a$ alloy can exhibit a strong uniaxial anisotropy.

EXAMPLE 2

Samples of the dual spin-valve magnetic sensing element shown in FIG. 6 were prepared using a $(Co_{0.67}Fe_{0.33})_{100-a}Al_a$ alloy for the free magnetic layer and the pinned magnetic layer.

Figure 8:
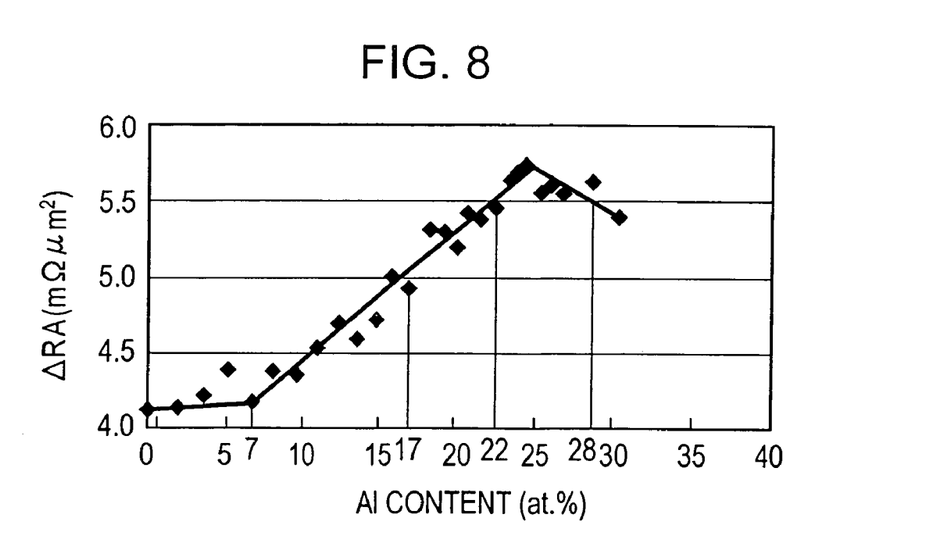
FIG. 8 is a plot of the relationship between the Al content (atomic percent) in and the product ΔRA of the dual spin-valve magnetic sensing element shown in FIG. 6, including a free magnetic layer and a pinned magnetic layer that are made of a $(Co_{0.67}Fe_{0.33})_{100-a}Al_a$ alloy.

FIG. 8 shows the relationship between the Al content (atomic percent) in the $(Co_{0.67}Fe_{0.33})_{100-a}Al_a$ alloy and the ΔRA value (product of the resistance variation ΔR and the element area A) of the magnetic sensing element.

The samples of the magnetic sensing element had the following structure:

substrate/Ta underlayer (30 Å)/NiFeCr seed layer (50 Å)/IrMn antiferromagnetic layer (70 Å)/pinned magnetic layer ($Co_{70}Fe_{30}$ first magnetic layer/Ru nonmagnetic interlayer (9.1 Å)/$Co_{40}Fe_{60}$ third magnetic layer (10 Å)/$(Co_{0.67}Fe_{0.33})_{100-a}Al_a$ second magnetic layer (40 Å))/Cu nonmagnetic material layer (43 Å)/ $(Co_{0.67}Fe_{0.33})_{100-a}Al_a$ free magnetic layer (80 Å)/Cu nonmagnetic material layer (43 Å)/pinned magnetic layer (($Co_{0.67}Fe_{0.33})_{100-a}Al_a$ second magnetic layer (40 Å)/$Co_{40}Fe_{60}$ third magnetic layer (10 Å)/Ru nonmagnetic interlayer (9.1 Å)/$Co_{70}Fe_{30}$ first magnetic layer)/ IrMn antiferromagnetic layer (70 Å)/Ta protective layer (200 Å).

When the second magnetic layer of the pinned magnetic layer and the free magnetic layer were formed of the $Co_{67}Fe_{33}$ alloy, or Al-free $(Co_{0.67}Fe_{0.33})_{100-a}Al_a$ alloy, the ΔRA value was 4.1 mΩ·μm². By adding Al to the $Co_{67}Fe_{33}$ alloy, the ΔRA value was increased. In particular, when the Al content in the $(Co_{0.67}Fe_{0.33})_{100-a}Al_a$ alloy was increased to 7 atomic percent or more, the ΔRA value rapidly increased, and when the Al content was 25 atomic percent, ΔRA reached its highest value, 5.7 mΩ·μm². The reason that an Al content of 25 atomic percent resulted in the highest ΔRA value is that the $(Co_{0.67}Fe_{0.33})_{100-a}Z_a$ alloy has a composition of Co:Fe:Al=2:1:1, which corresponds to a Heusler alloy having a L2$_1$ crystal structure.

Also, an Al content a in the $(Co_{0.67}Fe_{0.33})_{100-a}Al_a$ alloy in the range of 22 to 28 atomic percent resulted in a ΔRA value of 5.5 mΩ·μm$^2$ or more, and an Al content of 17 atomic percent or more resulted in a ΔRA value of 5.0 mΩ·μm$^2$. In the present example, the maximum Al content in the $(Co_{0.67}Fe_{0.33})_{100-a}Al_a$ alloy was set at 30 atomic percent.

What is claimed is:

1. A magnetic sensing element comprising:
a multilayer composite having a plurality of layers, the multilayer composite comprising:
a pinned magnetic layer whose magnetization is fixed in one direction;
a free magnetic layer;
a nonmagnetic material layer disposed between the pinned magnetic layer and the free magnetic layer; and
a nonmagnetic metal layer made of at least one material selected from the group consisting of X—Mn alloys, Ru, Re, Os, Ti, Rh, Ir, Pd, Pt, and Al, wherein X represents at least one element selected from the group consisting of Pt, Pd, Ir, Rh, Ru, Os, Ni, and Fe;
wherein the pinned magnetic layer comprises a plurality of sublayers, has an artificial ferromagnetic structure, and is constituted of a first magnetic layer and a second magnetic layer with a nonmagnetic interlayer therebetween,
wherein at least one of the plurality of sublayers of the pinned magnetic layer comprises a $(Co_{0.67}Fe_{0.33})_{100-a}Z_a$ alloy layer, wherein Z represents at least one element selected from the group consisting of Al, Ga, Si, Ge, Sn, and Sb, and parameter a satisfies 0<a≦30 in terms of atomic percent and the pinned magnetic layer has uniaxial anisotropy, and the uniaxial anisotropy fixes the magnetization of the pinned magnetic layer in one direction,
wherein the magnetization of the second magnetic layer is fixed in the direction antiparallel to that of the first magnetic layer,
wherein the first magnetic layer is disposed at a nonmagnetic metal layer side and the second magnetic layer is disposed at a nonmagnetic material layer side, and
wherein at least part of crystals in the nonmagnetic metal layer and first magnetic layer are in an epitaxial state or a heteroepitaxial state.

2. The magnetic sensing element according to claim 1, wherein parameter a satisfies 7≦a≦30 in terms of atomic percent.

3. The magnetic sensing element according to claim 2, wherein parameter a satisfies 22≦a≦28 in terms of atomic percent.

4. The magnetic sensing element according to claim 1, wherein Z represents at least one of Al and Ga.

5. The magnetic sensing element according to claim 4, wherein Z represents Al.

6. The magnetic sensing element according to claim 1, wherein the first magnetic layer has a thickness of from about 12 Å to about 40 Å.

7. The magnetic sensing element according to claim 1, wherein the nonmagnetic metal layer has a thickness in the range of from about 5 Å to about 50 Å.

8. The magnetic sensing element according to claim 1, wherein a nonmagnetic layer is disposed between the nonmagnetic metal layer and the pinned layer.

9. The magnetic sensing element according to claim 1, further comprising an underlayer underlying the $(Co_{0.67}Fe_{0.33})_{100-a}Z_a$ alloy layer, the underlayer having a body-centered cubic structure, the underlayer comprising a CoFe alloy having a composition expressed by $Co_{1-x}Fe_x$, wherein parameter x satisfies 25≦X≦95 in terms of atomic percent.

10. The magnetic sensing element according to claim 1, wherein the pinned magnetic layer has a thickness of from about 30 Å to about 80 Å.

11. The magnetic sensing element according to claim 1, wherein the second magnetic layer has a thickness of from about 30 Å to about 80 Å.

12. The magnetic sensing element according to claim 1, wherein current flows in a direction perpendicular to surfaces of the layers.

* * * * *